(12) United States Patent
Nakasu et al.

(10) Patent No.: US 10,532,567 B2
(45) Date of Patent: Jan. 14, 2020

(54) PIEZOELECTRIC ACTUATOR, METHOD FOR MANUFACTURING SAME, AND LIQUID DISCHARGE HEAD

(71) Applicant: CANON KABUSHIKI KAISHA, Tokyo (JP)

(72) Inventors: Minako Nakasu, Tokyo (JP); Motokazu Kobayashi, Yokohama (JP); Hiroto Numazawa, Kawasaki (JP); Toshio Tomiyoshi, Yokohama (JP); Youichi Fukaya, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/886,167

(22) Filed: Feb. 1, 2018

(65) Prior Publication Data

US 2018/0222184 A1    Aug. 9, 2018

(30) Foreign Application Priority Data

Feb. 7, 2017  (JP) .................................. 2017-020498
Apr. 4, 2017  (JP) .................................. 2017-074613

(51) Int. Cl.
```
B41J 2/045    (2006.01)
B41J 2/16     (2006.01)
B41J 2/14     (2006.01)
H01L 41/22    (2013.01)
H01L 41/29    (2013.01)
```

(52) U.S. Cl.
CPC ....... *B41J 2/04581* (2013.01); *B41J 2/14201* (2013.01); *B41J 2/1618* (2013.01); *H01L 41/22* (2013.01); *H01L 41/29* (2013.01); *B41J 2002/14225* (2013.01)

(58) Field of Classification Search
CPC .......................... B41J 2/04581; B41J 2/14201; B41J 2/14233; B41J 2/161; B41J 2/1618; B41J 2/1642; B41J 2/1645; H01L 41/22; H01L 41/28; H01L 41/29
See application file for complete search history.

(56) References Cited

U.S. PATENT DOCUMENTS

2011/0164098 A1 *  7/2011  Kobayashi et al. ............ 347/71
2014/0084753 A1 *  3/2014  Shibuya ......................... 310/85

FOREIGN PATENT DOCUMENTS

JP    2003-17767 A      1/2003
JP    2013-118232 A     6/2013

\* cited by examiner

*Primary Examiner* — Juanita D Jackson
(74) *Attorney, Agent, or Firm* — Canon U.S.A. Inc., IP Division

(57) ABSTRACT

A piezoelectric actuator has a ground substrate layer, an intermediate layer containing at least one of Ti and $TiO_2$ on the ground substrate layer, an electrode layer containing Pt on the intermediate layer, and a piezoelectric layer containing lead zirconate titanate on the electrode layer, in which the lead zirconate titanate contained in the piezoelectric layer is preferentially oriented in the (100), (001), or (110) direction, the Pt contained in the electrode layer is preferentially oriented in the (111) direction, and the half width of the rocking curve in the (111) plane of the Pt contained in the electrode layer in X-ray diffraction is 1° or more.

11 Claims, 5 Drawing Sheets

PIEZOELECTRIC ACTUATOR, METHOD FOR MANUFACTURING SAME, AND LIQUID DISCHARGE HEAD

BACKGROUND OF THE INVENTION

Field of the Invention

The present disclosure relates to a piezoelectric actuator, a method for manufacturing the same, and a liquid discharge head.

Description of the Related Art

A piezoelectric actuator having a piezoelectric element is used for a liquid discharge head discharging liquid, such as ink, for example, from the viewpoint that the displacement amount can be controlled with good accuracy. On the other hand, from the viewpoint of improving various kinds of piezoelectric performance of the piezoelectric element, a development focusing on the crystallinity in each functional layer of the piezoelectric element has been made.

For example, Japanese Patent Laid-Open No. 2013-118232 describes a technique relating to a piezoelectric element focusing on the half width of the peak by a X-ray diffraction rocking curve method. According to the technique described in Japanese Patent Laid-Open No. 2013-118232, the half width of the rocking curve of a piezoelectric layer is controlled. On the other hand, according to the technique described in Japanese Patent Laid-Open No. 2003-17767, various kinds of piezoelectric performance are improved by controlling the half width of the rocking curve of an electrode layer.

SUMMARY OF THE INVENTION

A piezoelectric actuator has been required to hardly cause a displace amount reduction in repeated driving. It is an object of the present disclosure to provide a piezoelectric actuator in which a displacement amount reduction by repeated drive is suppressed. It is another object of the present disclosure to provide a liquid discharge head having liquid discharge performance having high durability against repeated use.

A piezoelectric actuator according to the present disclosure has a ground substrate layer, an intermediate layer containing at least one of Ti and $TiO_2$ on the ground substrate layer, an electrode layer containing Pt on the intermediate layer, and a piezoelectric layer containing lead zirconate titanate on the electrode layer, in which the lead zirconate titanate contained in the piezoelectric layer is preferentially oriented in the (100), (001), or (110) direction, the Pt contained in the electrode layer is preferentially oriented in the (111) direction, and the half width of the rocking curve in the (111) plane of the Pt contained in the electrode layer in X-ray diffraction is 10 or more.

A liquid discharge head according to the present disclosure has the piezoelectric actuator according to the present disclosure and discharges liquid by driving of the piezoelectric actuator.

A method for manufacturing a piezoelectric actuator according to the present disclosure includes a process of forming an intermediate layer containing at least one of Ti and $TiO_2$ on a ground substrate layer, a process of forming an electrode layer containing Pt on the intermediate layer, and a process of forming a piezoelectric layer containing lead zirconate titanate on the electrode layer, in which the surface resistance of the intermediate layer after the process of forming the intermediate layer and before the process of forming the electrode layer is 3 k$\Omega$/□ or more.

Further features of the present disclosure will become apparent from the following description of exemplary embodiments with reference to the attached drawings.

DESCRIPTION OF THE EMBODIMENTS

Piezoelectric Actuator

A piezoelectric actuator according to the present disclosure has a ground substrate layer, an intermediate layer containing at least one of Ti and $TiO_2$ on the ground substrate layer, an electrode layer containing Pt on the intermediate layer, and a piezoelectric layer containing lead zirconate titanate on the electrode layer. Herein, the lead zirconate titanate (hereinafter also referred to as PZT) contained in the piezoelectric layer is preferentially oriented in the (100), (001), or (110) direction. The Pt contained in the electrode layer is preferentially oriented in the (111) direction. In X-ray diffraction, the half width of the rocking curve in the (111) plane of the Pt contained in the electrode layer is 1° or more.

In the present disclosure, the PZT contained in the piezoelectric layer and the Pt contained in the electrode layer are preferentially oriented in the above-mentioned direction and the half width of the rocking curve in the (111) plane of the Pt contained in the electrode layer is 1° or more, and therefore the crystallinity in the (111) plane decreases. The present inventors have found that a piezoelectric actuator satisfying such conditions can suppress the displacement amount reduction by repeated drive. Hereinafter, an embodiment of the piezoelectric actuator according to the present disclosure is described but the present disclosure is not limited to the embodiment.

Figure 1:
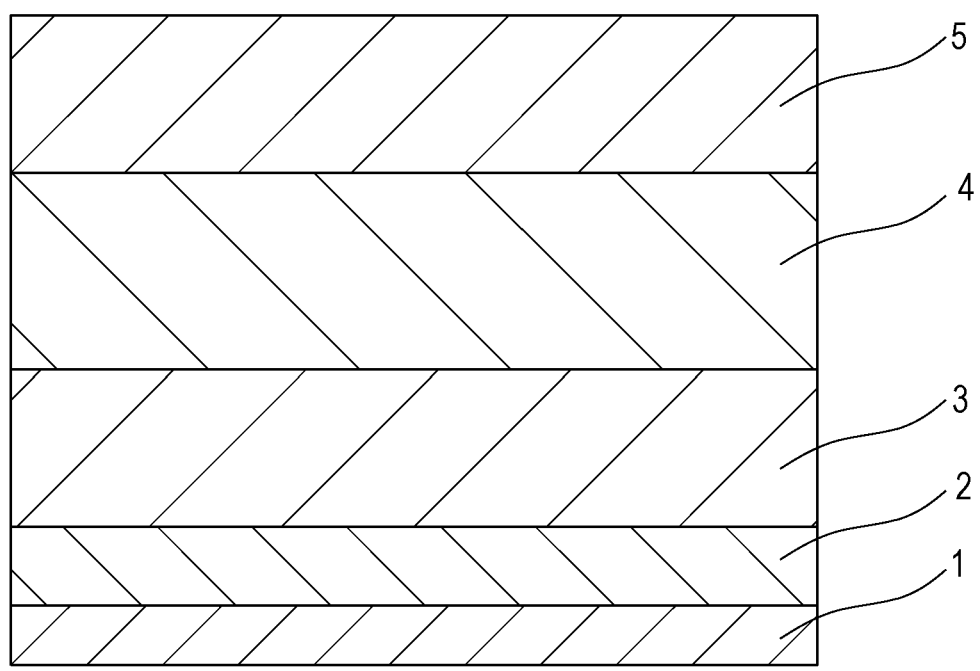
FIG. 1 is a cross-sectional view illustrating an example of a piezoelectric actuator.

FIG. 1 illustrates an example of the piezoelectric actuator according to the present disclosure. The piezoelectric actuator illustrated in FIG. 1 has a ground substrate layer 1, an intermediate layer 2, a lower electrode 3, a piezoelectric layer 4, and an upper electrode 5 in this order. In the piezoelectric actuator, the lower electrode 3 is equivalent to the electrode layer in the present disclosure. The piezoelectric actuator may have other layers other than the ground substrate layer 1, the intermediate layer 2, the lower electrode 3, the piezoelectric layer 4, and the upper electrode 5. It is suitable that the ground substrate layer 1, the intermediate layer 2, the lower electrode 3, the piezoelectric layer 4, and the upper electrode 5 are in contact with each other.

Ground Substrate Layer

It is suitable that the ground substrate layer 1 has a smooth surface, can prevent diffusion of elements in heat treatment, and has sufficient mechanical strength. Materials of the ground substrate layer 1 are suitably materials which are not deformed or melted in heat treatment which may be carried out in the formation process of each layer on the ground substrate layer 1, and, for example, $SiO_2$, SiN, and the like are mentioned. These materials may be used alone or in combination of two or more kinds thereof. When manufacturing a liquid discharge head using the piezoelectric actuator according to the present disclosure, a ground substrate having the ground substrate layer 1 may be a diaphragm vibrating a pressure chamber and may also serve as a substrate for forming the pressure chamber. For example, the ground substrate layer 1 containing $SiO_2$, SiN, and the like can be formed on the surface of a ground substrate, such as a semiconductor substrate containing silicon (Si) and the like, a metal substrate containing tungsten (W), heat-resistant stainless steel (SUS), and the like, and a ceramic substrate containing zirconia, alumina, silica, and the like. Specifically, by oxidizing or nitriding an Si substrate, the surface thereof can be reformed into a layer containing $SiO_2$ or SiN. The materials of the ground substrate mentioned above may be used alone or in combination of two or more kinds thereof. The ground substrate may have a multilayer configuration by laminating two or more the materials.

Intermediate Layer

The intermediate layer 2 is a layer disposed on the ground substrate layer 1 and inserted in order to improve the adhesiveness between the ground substrate layer 1 and the electrode layer (lower electrode 3). From the viewpoint that the adhesiveness is high, the intermediate layer 2 contains at least one of Ti and $TiO_2$. The intermediate layer 2 may contain a single layer or may contain a plurality of layers. When the intermediate layer 2 contains a plurality of layers, the intermediate layer 2 can be a layer containing a laminate of a layer containing Ti and a layer containing $TiO_2$. The thickness of the intermediate layer 2 is preferably 2 nm or more and 50 nm or less, more preferably 2 nm or more and 30 nm or less, and still more preferably 3 nm or more and 10 nm or less. Due to the fact that the thickness of the intermediate layer 2 is 2 nm or more, sufficient adhesiveness can be demonstrated. Due to the fact that the thickness of the intermediate layer 2 is 50 nm or less, the used amount of the materials can be reduced and the cost can be reduced.

Electrode Layer

It is suitable that the electrode layer is suitably disposed on the intermediate layer 2 and contains Pt and consists of Pt. Examples of the electrode layer include a Pt metal film and an oxide film containing Pt, for example. The electrode layer may contain materials usually used for the piezoelectric element containing Pt besides Pt. Examples of the materials include metals, such as Ti, Ta, Ir, Sr, In, Sn, Au, Al, Fe, Cr, and Ni, and oxides thereof, for example. These substances may be used alone or in combination of two or more kinds thereof. The electrode layer may contain a single layer or may contain a laminate containing two or more layers. The thickness of the electrode layer is preferably 10 nm or more and 1000 nm or less, more preferably 50 nm or more and 500 nm or less, and still more preferably 100 nm or more and 300 nm or less. Due to the fact that the thickness of the electrode layer is 10 nm or more, stable conductivity can be imparted. Moreover, due to the fact that the thickness of the electrode layer is 1000 nm or less, the used amount of the materials can be reduced and the cost can be reduced. In the piezoelectric actuator illustrated in FIG. 1, the lower electrode 3 is equivalent to the electrode layer and the same materials as those of the electrode layer can also be used for the upper electrode 5 and the upper electrode 5 can have the same layer configuration and the same thickness.

In the present disclosure, the Pt contained in the electrode layer is preferentially oriented in the (111) direction. Due to the fact that the Pt is preferentially oriented in the (111) direction, a displacement amount reduction in repeated drive of the piezoelectric actuator can be suppressed. The orientation of the Pt contained in the electrode layer can be determined by a method described later.

In the present disclosure, the half width of the rocking curve in the (111) plane of the Pt contained in the electrode layer in X-ray diffraction is 1° or more. The half width is preferably 1.1° or more and more preferably 1.2° or more. The upper limit of the half width is not particularly limited and can be set to 3° or less, for example. Due to the fact that the half width is 1° or more, the crystallinity in the (111) plane of the Pt contained in the electrode layer decreases and the displacement amount reduction in repeated drive of the piezoelectric actuator can be suppressed. The half width can be measured by a method described later.

Piezoelectric Layer

It is suitable that the piezoelectric layer 4 is disposed on the electrode layer and contains lead zirconate titanate (PZT) and consists of PZT. The composition of the PZT is not particularly limited and PZT having a perovskite crystal represented by $Pb_y(Zr_xTi_{1-x})O_3$ (x=0.4 to 0.6, y=1.00 to 1.20) is suitable. By setting the compositions of Zr and Ti within the range mentioned above, a perovskite crystal having high piezoelectricity can be obtained. As the crystal structure of the PZT, a tetragon, a rhombohed, and the like can be taken. From the viewpoint that the polarization directions of the piezoelectric layer 4 can be easily aligned in the film thickness direction, the tetragon is suitable.

Into the piezoelectric layer 4, elements other than Pb, Zr, and Ti may be doped. As the elements usable as a dopant, La, Ca, Sr, Ba, Sn, Th, Y, Sm, Ce, Bi, Sb, Nb, Ta, W, Mo, Cr, Co, Ni, Fe, Cu, Si, Ge, Sc, Mg, Mn, and the like can be mentioned, for example. One kind or two or more kinds of these elements may be added. The addition amount of the elements is preferably 0.1 to 2 parts by mass based on 100 parts by mass of the PZT.

The thickness of the piezoelectric layer 4 is preferably 10 nm or more and 20 µm or less, more preferably 100 nm or more and 1000 nm or less, and still more preferably 150 nm or more and 400 nm or less. Due to the fact that the thickness of the piezoelectric layer 4 is 10 nm or more, the piezoelectric layer 4 has excellent piezoelectric characteristics. Moreover, due to the fact that the thickness of the piezoelectric layer 4 is 20 µm or less, epitaxial crystal growth in the thickness direction can be effectively performed in the formation of the piezoelectric layer 4.

In the present disclosure, the PZT contained in the piezoelectric layer 4 is preferentially oriented in the (100), (001), or (110) direction. Due to the fact that the PZT is preferentially oriented in the (100), (001), or (110) direction, the displacement amount reduction in repeated drive of the piezoelectric actuator can be suppressed. The orientation of the PZT contained in the piezoelectric layer 4 can be determined by a method described later.

Other Layers

The piezoelectric actuator according to the present disclosure may have an orientation control layer, a barrier layer, and the like, for example, besides the layers described above.

Method for Manufacturing Piezoelectric Actuator

A method for manufacturing a piezoelectric actuator according to the present disclosure includes a process of forming an intermediate layer containing at least one of Ti and $TiO_2$ on a ground substrate layer, a process of forming an electrode layer containing Pt on the intermediate layer, and a process of forming a piezoelectric layer containing lead zirconate titanate on the electrode layer. Herein, the surface resistance of the intermediate layer after the process of forming the intermediate layer and before the process of forming the electrode layer is 3 k$\Omega$/□ or more.

According to the method of the present disclosure, due to the fact that the surface resistance of the intermediate layer is 3 k$\Omega$/□ or more after the process of forming the intermediate layer and before the process of forming the electrode layer, the crystallinity in the (111) plane of the Pt contained in the intermediate layer adjacent to the electrode layer decreases. Therefore, it is presumed that the half width of the rocking curve method in X-ray diffraction in the (111) plane increases and the displacement amount reduction in repeated drive of the piezoelectric actuator to be obtained can be suppressed. Hereinafter, an embodiment of each process of the method according to the present disclosure is described but the present disclosure is not limited to the embodiments.

Formation Process of Intermediate Layer

In this process, the intermediate layer containing at least one of Ti and TiO$_2$ is formed on the ground substrate layer. The ground substrate layer can be formed by oxidizing or nitriding an Si substrate to reform the surface into a layer containing SiO$_2$ or SiN as described above. The intermediate layer can be formed by sputtering Ti, for example.

The surface resistance of the intermediate layer to be formed is 3 k$\Omega$/□ or more, preferably 10 k$\Omega$/□ or more, more preferably 20 k$\Omega$/□ or more, and still more preferably 30 k$\Omega$/□ or more. The upper limit of the surface resistance is not particularly limited and can be 1 M$\Omega$/□ or less, for example. The surface resistance can be measured by a method described later.

Figure 6:
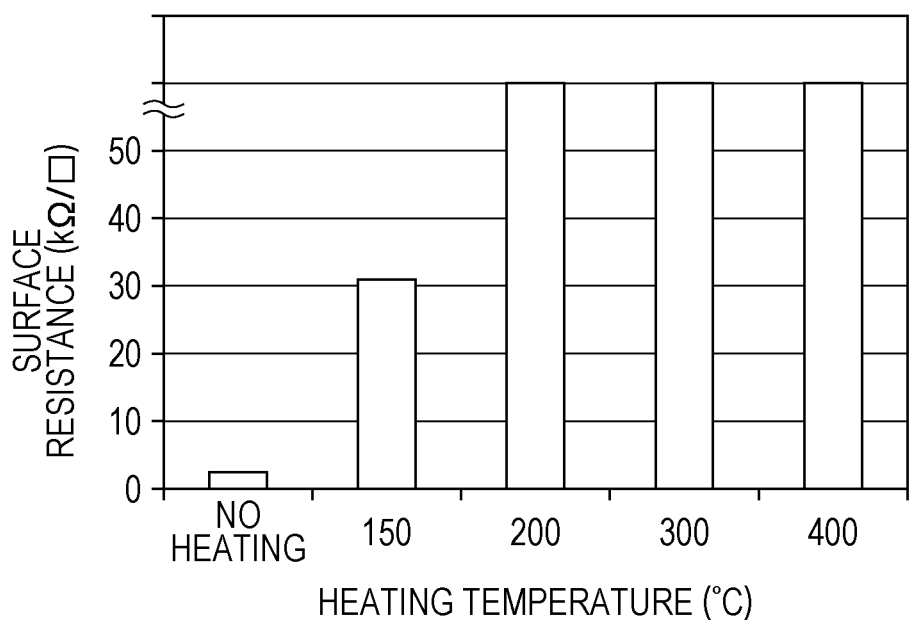
FIG. 6 is a graph illustrating the surface resistance of an intermediate layer to the heating temperature of the intermediate layer.

Herein, from the viewpoint of setting the surface resistance of the intermediate layer to 3 k$\Omega$/□ or more, it is suitable for the method according to the present disclosure to further include a process of heating the intermediate layer after the process of forming the intermediate layer and before a process of forming the electrode layer described later. By carrying out the heating process, there is a tendency that the oxidation of the Ti contained in the intermediate layer progresses and the surface resistance of the surface of the intermediate layer increases. For example, by increasing the heating temperature by carrying out heating, the surface resistance of the surface of the intermediate layer increases as illustrated in FIG. 6. The heating temperature in the heating process is preferably 150° C. or more, more preferably 150° C. or more and 1000° C. or less, and still more preferably 150° C. or more and 800° C. or less. Due to the fact that the heating temperature is 150° C. or more, the oxidation of the Ti contained in the intermediate layer can be sufficiently advanced. Due to the fact that the heating temperature is 1000° C. or less, roughness by the heat of Ti or SiO$_2$ can be prevented. The heating of the intermediate layer can be carried out by placing the substrate containing the intermediate layer on a hot plate, for example.

Formation Process of Electrode Layer

In this process, the electrode layer containing Pt is formed on the intermediate layer. The electrode layer may be formed by applying Pt and metals or oxides of the elements contained as necessary described above onto the intermediate layer by a sol-gel method or the like, followed by firing or may be formed by carrying out sputtering, vapor deposition, or the like, for example. Among the above, from the viewpoint of relatively less heat history, the sputtering is suitable. When forming the electrode layer by sputtering, several atomic layers on the sputtered surface are disturbed by ions and the remaining of irradiated ions and the formation of an amorphous layer sometimes occur. Therefore, in order to remove and stabilize the same, heat treatment can be performed after the sputtering. The heat treatment may be performed in a sputtering device or may be performed after taking out the resultant substance from a sputtering device. In the electrode layer formation, the electrode layer may be patterned into a desired shape. The formation process of the electrode layer is applicable not only to the formation of the lower electrode but the formation of the upper electrode.

Formation Process of Piezoelectric Layer

In this process, the piezoelectric layer containing lead zirconate titanate is formed on the electrode layer. The piezoelectric layer can be formed by a sputtering method, a Metal Organic Chemical Vapor Deposition (MOCVD method), a sol-gel method, and the like. Among the above, from the viewpoint that the piezoelectric layer can be simply formed at low cost, the sol-gel method is suitable. In the sol-gel method, a coating liquid containing a hydrolytic compound of each metal, a partially hydrolytic compound thereof, or a partial polycondensation compound thereof serving as the raw material is first prepared, for example. When adding the doping element described above, a compound containing the elements may be added in the preparation of the coating liquid. The prepared coating liquid is applied onto the electrode layer, and then the coating liquid is dried to form a dry coating layer. Thereafter, the dry coating layer is heated in the air, and then fired at a temperature equal to or higher than the crystallization temperature to be crystallized, whereby the piezoelectric layer can be formed.

Examples of methods similar to the sol-gel method include a Metal Organic Deposition (MOD) method. In the MOD method, a coating liquid containing pyrolytic organometallic compounds (metal complexes and metal organic acid salts), e.g., β-diketone complexes and carboxylic acid salts of metals, as the raw materials is applied onto the electrode layer. Next, the coating liquid is heated in the air or oxygen to cause evaporation of a solvent in the coating liquid and the pyrolysis of the organometallic compound, and further fired at a temperature equal to or higher than the crystallization temperature to be crystallized to thereby form the piezoelectric layer. In this specification, the sol-gel method, the MOD method, and a method combining the methods are collectively referred to as the "sol-gel method". Hereinafter, an example of a method for forming the piezoelectric layer by the sol-gel method is described. The method has a formation process of a coating layer, a formation process of a dry coating layer, and a heating process of the dry coating layer. In this specification, the "coating layer" represents a layer formed by an applied coating liquid before the evaporation of a solvent. The "dry coating layer" represents a layer after the evaporation of a solvent from the coating layer.

(1) Formation Process of Coating Layer

In this process, a coating liquid containing an organic solvent and a material (hereinafter also referred to as a precursor) of the piezoelectric layer is applied onto the electrode layer. Thus, a coating layer containing the organic solvent and the precursor is formed. Examples of the raw material of the precursor include hydrolytic compounds of metals, partial hydrolytic compounds thereof, partial polycondensation compounds thereof, pyrolytic compounds, and the like, for example. Specifically, an organometallic compound is mentioned. For example, metal complexes, such as alkoxides, organic acid salts, and β-diketone complexes of the metals, are mentioned. As the metal complexes, various complexes including an amine complex are usable. Examples of β-diketones for forming the β-diketone complexes include acetylacetone(2,4-pentanedione), heptafluorobutanoylpivaloylmethane(1-(heptafluoropropyl)-4,4-dimethyl-1,3-pentanedione), dipivaloylmethane(2,2,6,6-tetramethyl-3,5-heptanedione), trifluoroacetylacetone, benzoylacetone, and the like.

Specific examples of the organometallic compound are mentioned below. Examples of lead compounds include organic acid salts, such as lead acetate, and organic metal alkoxides, such as diisopropoxy lead. As a titanium compound, organic metal alkoxides, such as tetraethoxytitanium, tetraisopropoxytitanium, tetra-n-butoxytitanium, tetraisobutoxytitanium, tetra-tert-butoxytitanium, and dimethoxydiisopropoxytitanium, are suitable. As the titanium compound, organic acid salts or organic metal complexes are also usable. As a zirconium compound, organic metal alkoxides, organic acid salts, organic metal complexes, and the like of zirconium are usable as with the lead compound or the titanium compound. The same substances as those mentioned above are usable for the other metallic compounds but the other metallic compounds are not limited thereto. The organometallic compounds may be used alone or in combination of two or more kinds thereof. The organometallic compound may be a composite organometallic compound containing two or more kinds of metals besides the compounds containing one kind of metal described above.

The coating liquid can be prepared by the following method, for example. The coating liquid containing a composite organic metal oxide (containing two or more kinds of metals) which is a precursor can be prepared by dissolving or dispersing the organometallic compound of the raw materials mentioned above in a suitable organic solvent, heat treating the resultant substance, and then hydrolyzing the resultant substance, for example. The organic solvent is selected as appropriate from various known organic solvents in consideration of dispersibility, coatability, and the like. Examples of the organic solvent include, for example, alcohol-based solvents, such as methanol, ethanol, n-butanol, n-propanol, and isopropanol, ether-based solvents, such as tetrahydrofuran and 1,4-dioxane, cellosolve-based solvents, such as methyl cellosolve and ethyl cellosolve, amide-based solvents, such as N,N-dimethyl formamide, N,N-dimethyl acetamide, and N-methyl pyrrolidone, and nitrile-based solvents, such as acetonitrile. These substances may be used alone or in combination of two or more kinds thereof. Among the above, the alcohol-based solvents are suitable as the organic solvent. The amount of the organic solvent in the coating liquid is not particularly limited. It is suitable to adjust the amount of the organic solvent so that the metal solid content concentration is 15% by mass or more and 30% by mass or less. Due to the fact that the amount of the organic solvent in the coating liquid is within the range mentioned above, the thickness of the piezoelectric layer can be easily adjusted to 10 nm or more and 20 μm or less.

The proportion of each organometallic compound in the coating liquid when using two or more of the organometallic compounds is suitably set to the same proportion as that of the composition of a target PZT, e.g., $Pb_y(Zr_xTi_{1-x})O_3$ (x=0.4 to 0.6, y=1.00 to 1.20). In general, the lead compound has high volatility, and thus lead deficiency sometimes occurs by the evaporation in a heating process described later. Therefore, in anticipation of the deficiency, lead may be made to be slightly excessively present by 2% by mol or more and 40% by mol or less based on the required lead amount in terms of the composition ratio, for example. The lead deficiency level varies depending on the type of the lead compound or the formation conditions of the piezoelectric layer and can be determined by an experiment.

Into the coating liquid, 1,8-diazabicyclo[5.4.0]-7-undecene, 1,5-diazabicyclo[4.3.0]non-5-ene, 1,4-diazabicyclo[2.2.2]octane, and the like can be added as a stabilizer. Moreover, as the other stabilizers, β-diketones (for example, acetylacetone, heptafluorobutanoylpivaloylmethane, dipivaloylmethane, trifluoroacetylacetone, and benzoylacetone), ketonic acids (for example, acetoacetic acid, propionyl acetic acid, benzoylacetic acid, and the like), lower alkyl esters, such as ethyl, propyl, and butyl of the ketonic acids, oxyacids (for example, lactic acid, glycolic acid, α-oxybutyric acid, salicylic acid, and the like), lower alkyl esters of the oxy acids, oxyketones (for example, diacetone alcohol, acetoin, and the like), α-amino acids (for example, glycine, alanine, and the like), alkanolamines (for example, diethanolamine, triethanolamine, and monoethanolamine), and the like may be used in combination. These substances may be used alone or in combination of two or more kinds thereof. The amount of the stabilizer in the coating liquid is preferably 0.05 times or more and 5 times or less and more preferably 0.1 times or more and 1.5 times or less the total number of moles of metal atoms.

In this process, a coating liquid is applied onto the electrode layer. As coating methods of the coating liquid, coating methods, such as spin coating, dip coating, bar coating, and spray coating, are usable. When applying the coating liquid, the surface to which the coating liquid is applied is suitably disposed in the horizontal direction (direction orthogonal to the vertical direction). Thus, the thickness of the coating layer and the distribution of the precursor in the coating layer can be made uniform. The number of coating times of the coating liquid is not particularly limited and the coating liquid may be applied once or may be applied two or more times. The thickness of the piezoelectric layer can be controlled by changing the concentration and the coating conditions of the precursor in the coating liquid. For example, when a coating liquid having a solid content concentration of 20% by mass or more and 25% by mass or less is applied by spin coating with a number of rotations of 2000 rpm, and then the coating liquid is dried and heated, a piezoelectric layer having a thickness of 200 nm or more and 330 nm or less can be formed by one coating.

(2) Formation Process of Dry Coating Layer

In this process, the organic solvent is evaporated from the coating layer, whereby the dry coating layer containing the precursor is obtained. The drying temperature in evaporating the organic solvent from the coating layer is a drying temperature suitable for the organic solvent to be used and is not particularly limited insofar as the temperature is less than the heating temperature in a heating process described later and is preferably 50° C. or more and more preferably 100° C. or more and 450° C. or less. This process can be performed by placing a member having the coating liquid in heat sources, such as a dryer, a hot plate, a tubular furnace, and an electric furnace, or by bringing a member having the coating liquid into direct contact with heat sources, such as a dryer, a hot plate, a tubular furnace, and an electric furnace. Among the above, it is suitable to perform the heating from the back surface of a member having the coating layer using a hot plate from the viewpoint of uniformity of the drying temperature.

This process is suitably performed so that the coated surface is placed in a calm environment. For example, it is suitable not to provide inlet ports or outlet ports of warm air, hot air, and the like near the coated surface. When the inlet ports or the outlet ports are provided near the coated surface, it is suitable to prevent the occurrence of the flow of the evaporated organic solvent or hot wind on the coated surface as much as possible. For example, the flow velocity of the gas at a 20 cm height above the coated surface can be set to be 0.05 m/s or less.

(3) Heating Process of Dry Coating Layer

In this process, the dry coating layer is heated to form the piezoelectric layer. This process can be carried out by the same method as that of the formation process of the dry coating layer. The heating temperature is preferably 500° C. or more and 800° C. or less. The heating in the process may be performed once or may be performed dividing the heating into a plurality of steps. In this process, it is suitable that the dry coating layer is heated to be calcinated, and then further fired at a temperature equal to or higher than the crystallization temperature to be crystallized to thereby form the piezoelectric layer.

Device for Producing Piezoelectric Layer

In the formation process of the piezoelectric layer, a device for producing a piezoelectric layer having a coating unit, a drying unit, and a heating unit is usable. The device can have a placement portion on which a member having the electrode layer can be placed. The coating unit is not particularly limited insofar as a coating liquid containing an organic solvent and a precursor can be applied onto the electrode layer to form a coating layer. The drying unit is not particularly limited insofar as the organic solvent can be evaporated from the coating layer to form a dry coating layer containing the precursor. The heating unit is not particularly limited insofar as the dry coating layer can be heated to form a piezoelectric layer.

Liquid Discharge Head

A liquid discharge head according to the present disclosure has the piezoelectric actuator according to the present disclosure and discharges liquid by driving of the piezoelectric actuator. Examples of a typical application example of the liquid discharge head include an ink jet head to be applied to an ink jet apparatus which discharges ink to perform recording. However, the liquid discharge head is not limited to the use and can be applied to devices, such as a printer, a copying machine, a facsimile having a communication system, and a word processor having a printer portion and further can be applied to industrial recording devices combining various processing devices in a complex manner. For example, the liquid discharge head is also usable for biochip manufacturing, electronic circuit printing, semiconductor substrate manufacturing, and the like. Since the piezoelectric actuator according to the present disclosure hardly causes the displacement amount reduction in repeated drive, the liquid discharge head according to the present disclosure has liquid discharge performance having high durability against repeated use. Hereinafter, embodiments of the liquid discharge head according to the present disclosure are described with reference to the drawings but the present disclosure is not limited to the embodiments.

Figure 3:
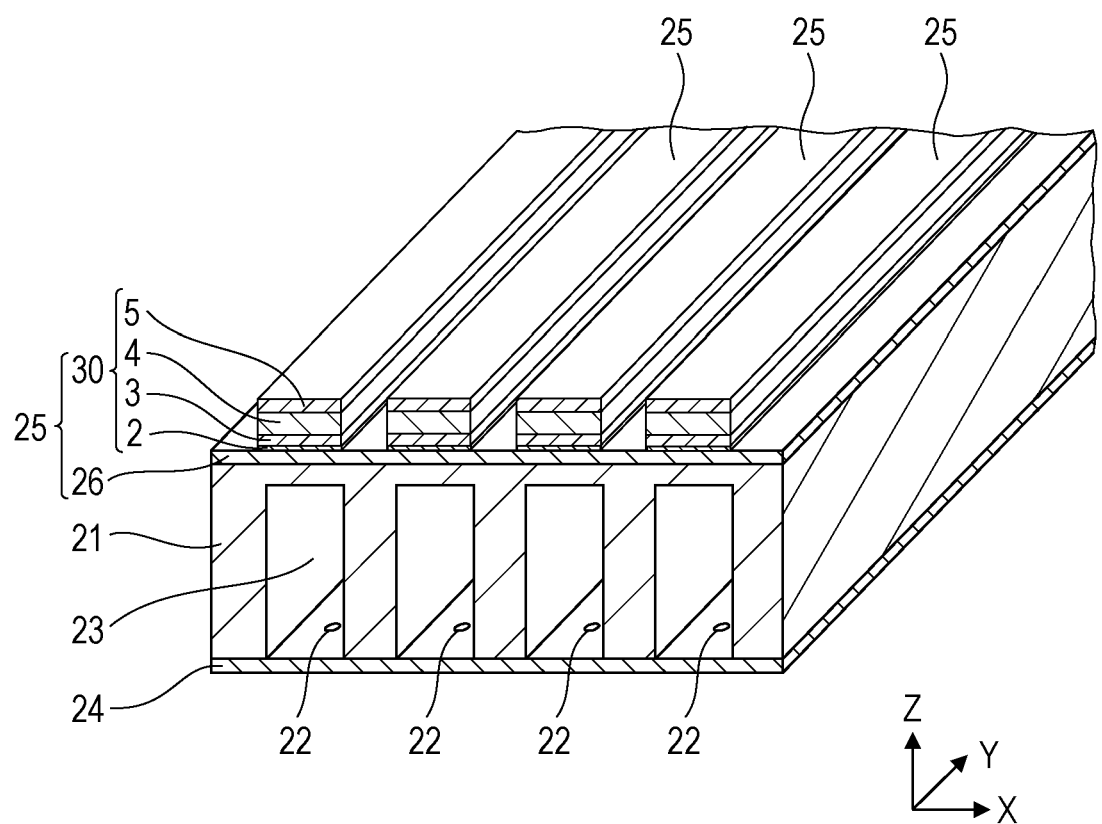
FIG. 3 is a perspective cross-sectional view illustrating an example of a liquid discharge head.
Figure 4:
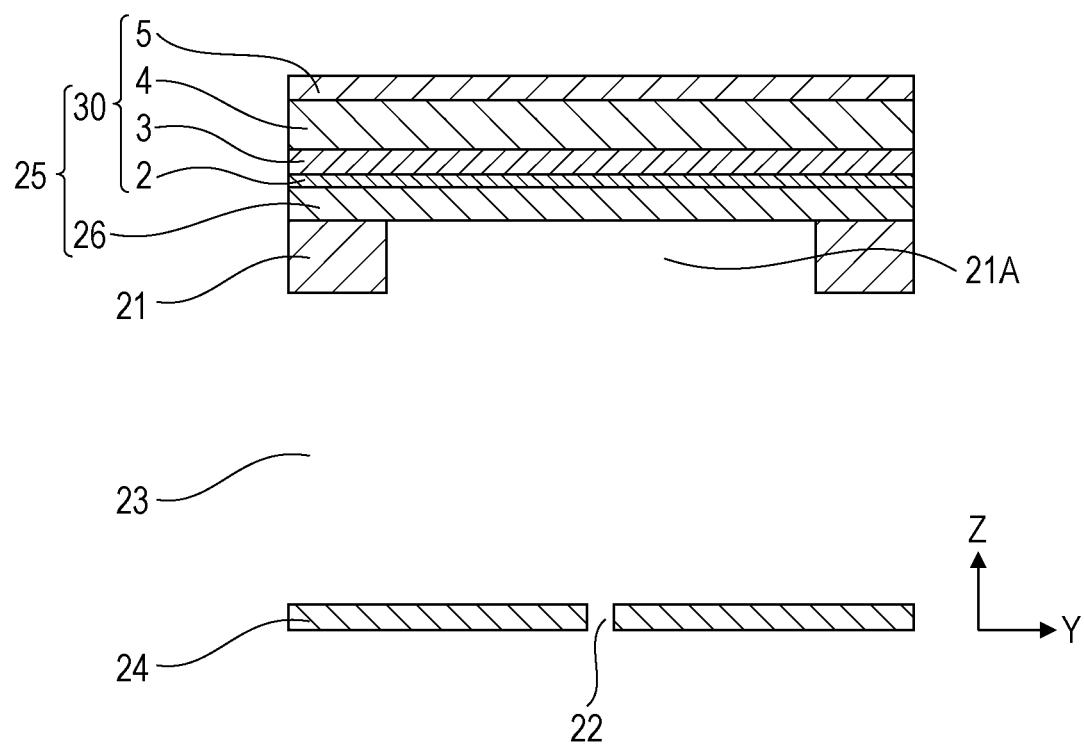
FIG. 4 is a cross-sectional view illustrating an example of the liquid discharge head.

FIG. 3 and FIG. 4 illustrate one embodiment of the liquid discharge head according to the present disclosure. A liquid discharge head illustrated in FIG. 3 has a liquid discharge head substrate 21, liquid discharge ports 22, pressure chambers 23 each formed corresponding to the discharge ports 22, and piezoelectric actuators 25 each disposed corresponding to the pressure chambers 23. The pressure chamber 23 communicates with the discharge port 22 and causes capacity changes of liquid in the pressure chamber 23 by vibration of the piezoelectric actuator 25 to discharge liquid droplets from the discharge port 22. The discharge ports 22 are formed with a predetermined interval in a discharge port formation member 24. The pressure chambers 23 are formed in parallel in a liquid discharge head substrate 21 so that the pressure chambers 23 each correspond to the discharge ports 22. The discharge ports 22 are provided in the surface facing the pressure generating surface by the piezoelectric actuators 25 but may be provided on the surface other than the surface facing the pressure generating surface. The piezoelectric actuator 25 contains a diaphragm 26 and a piezoelectric element 30. The diaphragm 26 is equivalent to the ground substrate and a ground substrate layer (not illustrated) is provided on the surface of the diaphragm 26. The piezoelectric element 30 contains the intermediate layer 2 contacting the ground substrate layer, the lower electrode 3 on the intermediate layer 2, the piezoelectric layer 4 on the lower electrode 3, and the upper electrode 5 on the piezoelectric layer 4. When the intermediate layer 2 has conductivity, the intermediate layer 2 configures a part of the lower electrode 3. As illustrated in FIG. 4, an opening 21A is formed in the surface on which the piezoelectric actuators 25 are disposed of the liquid discharge head substrate 21 so as to correspond to each of the discharge ports 22. The piezoelectric actuator 25 is disposed so as to close the opening 21A. In FIG. 4, the diaphragm 26 is exposed to the pressure chamber 23 by the opening 21A. The diaphragm 26 may be covered with the liquid discharge head substrate 21 insofar as liquid in the pressure chamber 23 can be discharged from the discharge port 22 by vibration generated in the piezoelectric actuator 25. The ground substrate layer and the piezoelectric element 30 may be directly formed on the liquid discharge head substrate 21 without providing the diaphragm 26.

EXAMPLES

Hereinafter, the present disclosure is more specifically described with reference to Examples but the present disclosure is not particularly limited by the following Examples. The evaluation of the piezoelectric actuator was performed by the following methods.

(1) Half Width of Rocking Curve in (111) Plane of Pt

The crystallinity of a thin film can be determined based on the half width of the peak of the rocking curve in X-ray diffraction measurement. When the half width is larger, it can be judged that the crystallinity in the oriented surface represented by the peak is disturbed and the orientations are not aligned.

The rocking curve described in the present disclosure relates to the curve of the (111) plane of Pt having a peak at 18° to 20°. As the conditions of the rocking curve X-ray diffraction measurement, the slit width was ⅙°, the X-ray tube voltage was 40 kV, and the X-ray tube current was 10 mA. The measurement of the half width of the rocking curve was carried out by irradiating a substrate before the piezoelectric layer formation with X-rays from the side opposite to the substrate of the piezoelectric layer.

(2) Surface Resistance of Intermediate Layer

The surface resistance of the intermediate layer was measured with a direct current 4 probe method by K-705 RD-B (Trade Name) manufactured by Kyowa Riken Co., Ltd. The surface resistance of the intermediate layer was a resistance value in the intermediate layer surface after heating the silicon substrate on which the intermediate layer containing Ti was formed for 5 minutes with a hot plate and was calculated as the average value of five points in total of the four corners and a central portion of an about 5 cm square substrate because the in-plane variation was large.

(3) Displacement Amount Reduction Rate by Repeated Drive

Figure 2:
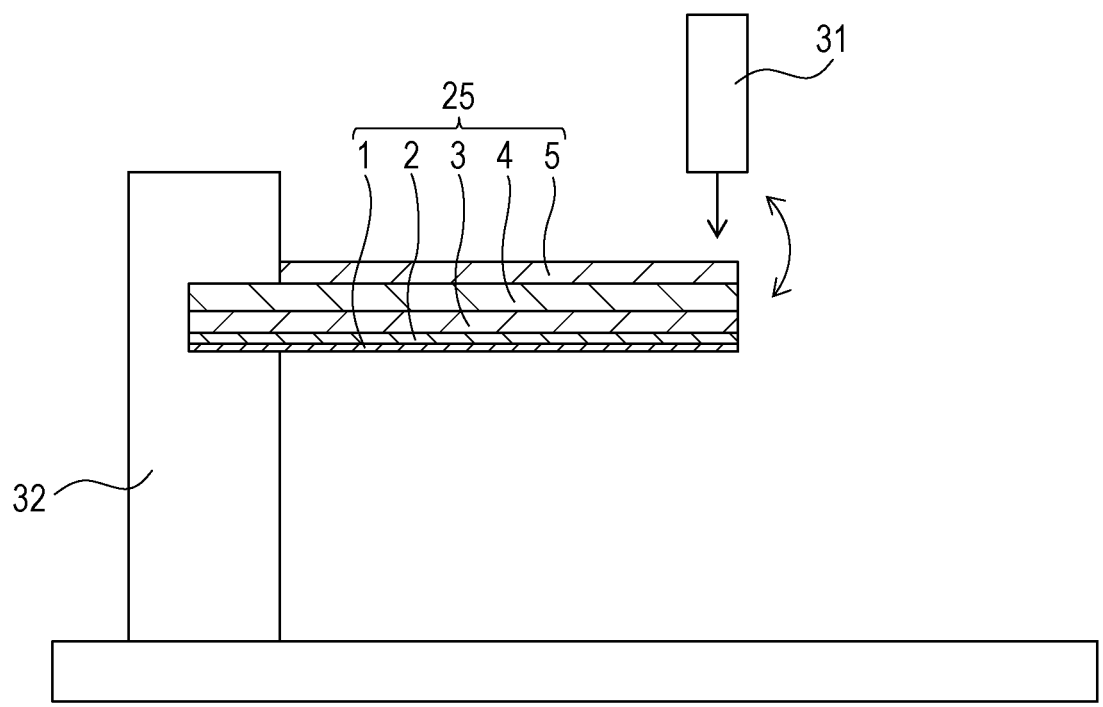
FIG. 2 is a schematic view illustrating a method for evaluating the displacement amount of the piezoelectric actuator.

The displacement amount reduction rate by repeated drive was measured by the following method. On a part of the piezoelectric actuator, a 20 nm thick platinum thin film was laminated by a sputtering method. Then, the piezoelectric actuator in which the long side of the lower electrode portion was set to 6 mm and the short side thereof was set to 1.5 mm and the long side of a site clamping the piezoelectric actuator (site where no lower electrode was provided) was set to 4 mm was cut out. Thus, a unimorph cantilever 25 having a long side of 10 mm (in which a displacement portion was 6 mm and a clamping portion was 4 mm) and having a short side of 1.5 mm was manufactured. FIG. 2 is a schematic view of a method for evaluating the displacement amount of the piezoelectric actuator. As illustrated in the schematic view, the unimorph cantilever 25 was clamped with a clamping site 32, and then the displacement amount when a voltage was applied was measured by a laser Doppler displacement meter 31.

The repeated drive was realized by placing the unimorph cantilever 25 on a hot plate at a temperature of 130° C. Furthermore, a sine wave with a frequency of 5 kHz was applied for 5 minutes at a peak-to-peak voltage of −32 V and an offset voltage of −16 V, and then continuous repeated drive was performed by 1,500,000 times to thereby perform aging. The displacement amount was measured by applying a sine wave with a frequency of 5 kHz to the unimorph cantilever 25 at a peak-to-peak voltage of +10 V and an offset voltage of +5 V and using the laser Doppler displacement meter 31. By performing the displacement amount measurement before and after the repeated drive, the displacement amount reduction rate by the repeated drive was calculated.

(4) Orientation of Lead Zirconate Titanate (PZT) and Pt

The orientations of the PZT contained in the piezoelectric layer and the Pt contained in the electrode layer were determined by X-ray structure analysis.

(5) Crystal Structure of PZT

The crystal structure of the PZT was determined by X-ray structure analysis.

Example 1

Production of PZT Coating Liquid

As a coating liquid for forming a piezoelectric layer, a PZT coating liquid having a metal composition represented by Pb/Zr/Ti=1.2/0.52/0.48 (Atomic ratio) was prepared by the following method. 1.2 mol of lead acetate hydrate was heated to be dehydrated, 1.2 mol of 1,8-diazabicyclo[5.4.0]-7-undecene and 9.0 mol of 1-methoxy-2-propanol were mixed as a stabilizer with the resultant lead acetate hydrate, and then the mixture was heated and stirred to be reacted. Thereafter, 0.52 mol of tetra-n-butoxyzirconium and 0.48 mol of tetraisopropoxytitanium were added, and then further heated to be reacted to compound the metallic compounds with each other. Next, 5.0 mol of water, 5.0 mol of ethanol, 3.8 mol of acetic acid, and 0.6 mol of acetylacetone were added, and then a hydrolysis reaction was performed to obtain a precursor which is a composite organic metal oxide. Thereafter, a solvent having a boiling point of 100° C. or less was completely removed with a rotary evaporator. Diethylene glycol monoethyl ether was added as an organic solvent, and then the concentration was adjusted so that the concentration of a metal oxide in terms of the composition formula was 23% by mass to prepare a PZT coating liquid.

Manufacturing of Piezoelectric Actuator

A silicon substrate 6 inches (15 cm) in diameter was prepared. By thermally oxidizing the surface of the silicon substrate, a 500 nm thick ground substrate layer containing silica ($SiO_2$) was provided on the silicon substrate. On the ground substrate layer, a 5 nm thick intermediate layer containing Ti was formed by sputtering. Thereafter, the silicon substrate was placed on a hot plate (manufactured by As One Corporation, Trade Name: "Shamal Hot Plate HHP-411"), and then heated at 150° C. for 5 minutes. Next, a 150 nm thick lower electrode containing Pt was formed on the intermediate layer by a sputtering method. Thereafter, the silicon substrate was placed on the hot plate, and then heated at 400° C. for 5 minutes. The Pt contained in the lower electrode was preferentially oriented in the (111) direction.

Next, the PZT coating liquid prepared as described above was applied onto the lower electrode with a spin coater (4000 rpm, 15 seconds) (Formation process of coating layer). Next, the silicon substrate to which the PZT coating liquid was applied was placed on the hot plate (Temperature unevenness of plate surface: 280° C.±1° C.) heated to 280° C. for 5 minutes to evaporate the organic solvent in the PZT coating liquid (Formation process of dry coating layer). Herein, the hot plate was disposed in a calm environment (measured at an air velocity of 0 m/s at a 2 cm position above the silicon substrate using an anemometer (manufactured by CEM, Trade Name: "DT-8880")) and a closure plate and the like were not provided. Thereafter, the silicon substrate was put into a 650° C. electric furnace for 10 minutes (Heating process of dry coating layer) to form a 250 nm thick piezoelectric layer containing $Pb_{1.2}(Zr_{0.52}Ti_{0.48})O_3$. The $Pb_{1.2}(Zr_{0.52}Ti_{0.48})O_3$ contained in the piezoelectric layer was preferentially oriented in the (100) direction and the crystal structure was a tetragon. Next, a 120 nm thick upper electrode containing gold was formed on the piezoelectric layer by a sputtering method. Thus, a piezoelectric actuator was manufactured.

The piezoelectric actuator was evaluated for the half width of the rocking curve in the (111) plane of the Pt contained in the electrode layer, the surface resistance of the intermediate layer, and the displacement amount reduction rate by repeated drive by the methods described above. The results are shown in Table 1.

Examples 2 to 12 and Comparative Examples 1 to 3

Piezoelectric actuators were manufactured and evaluated in the same manner as in Example 1, except changing each of the heating temperature after forming the intermediate layer and the heating temperature after forming the lower electrode into the temperatures shown in Table 1. The results are shown in Table 1.

TABLE 1

| | Heating temperature (° C.) After formation of intermediate layer | Heating temperature (° C.) After formation of lower electrode layer | Orientation PZT | Orientation Pt | PZT crystal structure | Half width of rocking curve in (111) plane of Pt (° C.) | Surface resistance of intermediate layer (kΩ/□) | Displace amount reduction rate by repeated drive (%) |
|---|---|---|---|---|---|---|---|---|
| Ex. 1 | 400 | 400 | 100 | 111 | Tetragon | 1.22 | 50 or more | 0.059 |
| Ex. 2 | 400 | 280 | 100 | 111 | Tetragon | 1.27 | (outside measurement range) | 0.146 |
| Ex. 3 | 400 | No heating | 100 | 111 | Tetragon | 1.46 | | 0.183 |
| Ex. 4 | 300 | 400 | 100 | 111 | Tetragon | 1.31 | | 0.195 |
| Ex. 5 | 300 | 280 | 100 | 111 | Tetragon | 1.37 | | 0.183 |
| Ex. 6 | 300 | No heating | 100 | 111 | Tetragon | 1.21 | | 0.189 |
| Ex. 7 | 200 | 400 | 100 | 111 | Tetragon | 1.42 | | 0.020 |
| Ex. 8 | 200 | 280 | 100 | 111 | Tetragon | 1.35 | | 0.072 |
| Ex. 9 | 200 | No heating | 100 | 111 | Tetragon | 1.38 | | 0.125 |
| Ex. 10 | 150 | 400 | 100 | 111 | Tetragon | 1.54 | 30.764 | 0.106 |
| Ex. 11 | 150 | 280 | 100 | 111 | Tetragon | 1.44 | | 0.155 |
| Ex. 12 | 150 | No heating | 100 | 111 | Tetragon | 1.31 | | 0.188 |
| Comp. Ex. 1 | No heating | 400 | 100 | 111 | Tetragon | 0.76 | 2.3005 | 0.281 |
| Comp. Ex. 2 | No heating | 280 | 100 | 111 | Tetragon | 0.82 | | 0.208 |
| Comp. Ex. 3 | No heating | No heating | 100 | 111 | Tetragon | 0.87 | | 0.354 |

Table 1 showed that, in Examples 1 to 12 in which the half width of the rocking curve in the (111) plane of the Pt contained in the electrode layer was 1° or more, the displacement amount reduction rate by repeated drive was 0.2% or less and the displacement amount reduction by repeated drive was suppressed. Moreover, in Examples 1 to 12, the surface resistance of the intermediate layer was 3 kΩ/□ or more and the process of heating the intermediate layer after the formation of the intermediate layer was provided. On the other hand, it was found that the presence or absence of the heating process after the formation of the lower electrode did not participate in the displacement amount reduction rate by repeated drive.

Figure 5:
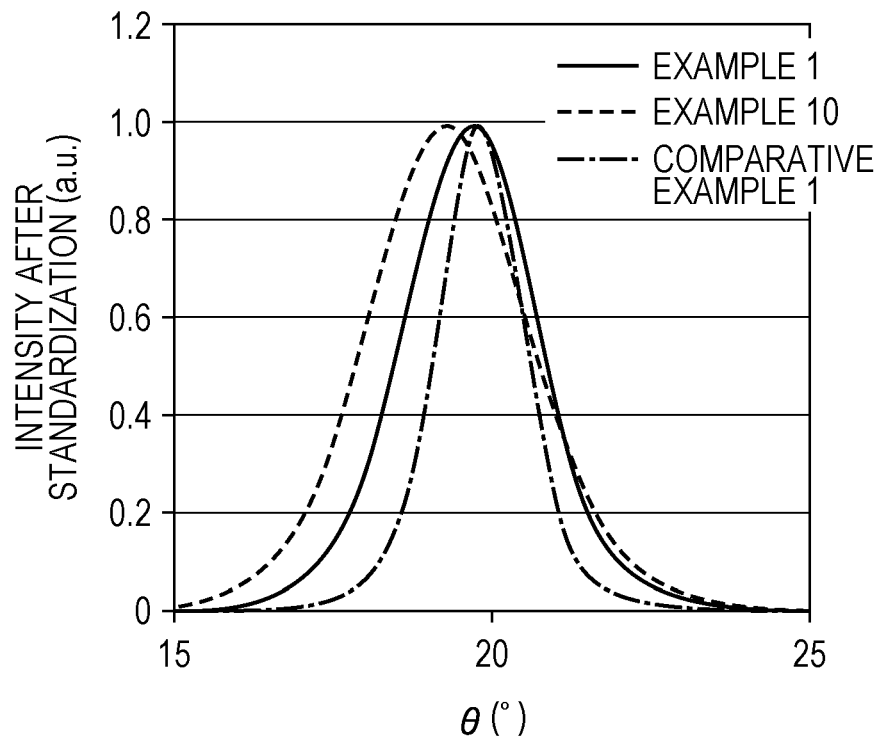
FIG. 5 is the spectra after standardization by a rocking curve method of the (111) plane of Pt in Example 1, Example 10, and Comparative Example 1.

In Examples 1 to 12 in which the intermediate layer was heated after the formation of the intermediate layer, the half width of the rocking curve in the (111) plane of the Pt was large and the crystallinity of the (111) plane of the Pt decreased as compared with Comparative Examples 1 to 3 in which heating was not performed. As a result, it is considered that the displacement amount reduction by repeated drive was suppressed in Examples 1 to 12 in which heating was performed. FIG. 5 illustrates the spectra after the standardization of the rocking curve method in the (111) plane of the Pt in Examples 1 and 10 and Comparative Example 1. It can be understand that the half width increases in Examples 1 and 10 in which the intermediate layer was heated after the formation of the intermediate layer as compared with Comparative Example 1 in which heating was not performed.

The present disclosure can provide a piezoelectric actuator in which the displacement amount reduction rate by repeated drive is suppressed. Moreover, the present disclosure can provide a liquid discharge head having liquid discharge performance having high durability against repeated use.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-020498 filed Feb. 7, 2017 and 2017-074613 filed Apr. 4, 2017 which are hereby incorporated by reference herein in their entirety.

What is claimed is:

1. A piezoelectric actuator comprising:
a ground substrate layer;
an intermediate layer containing at least one of titanium and titanium dioxide on the ground substrate layer;
an electrode layer containing platinum on the intermediate layer; and
a piezoelectric layer containing lead zirconate titanate on the electrode layer, wherein
the lead zirconate titanate contained in the piezoelectric layer is preferentially oriented in a (100), (001), or (110) direction,
the platinum contained in the electrode layer is preferentially oriented in a (111) direction, and
a half width of a rocking curve in a (111) plane of the platinum contained in the electrode layer in X-ray diffraction is 1° or more and 3° or less.

2. The piezoelectric actuator according to claim 1, wherein a thickness of the intermediate layer is 2 nm or more and 50 nm or less.

3. The piezoelectric actuator according to claim 1, wherein a thickness of the electrode layer is 10 nm or more and 1000 nm or less.

4. The piezoelectric actuator according to claim 1, wherein a thickness of the piezoelectric layer is 10 nm or more and 20 μm or less.

5. The piezoelectric actuator according to claim 1, wherein
a crystal structure of the lead zirconate titanate contained in the piezoelectric layer is a tetragon.

6. The piezoelectric actuator according to claim 1, wherein a thickness of the intermediate layer is 2 nm or more and 30 nm or less.

7. The piezoelectric actuator according to claim 1, wherein a thickness of the electrode layer is 50 nm or more and 500 nm or less.

8. The piezoelectric actuator according to claim 1, wherein a thickness of the piezoelectric layer is 100 nm or more and 1 μm or less.

9. The piezoelectric actuator according to claim 1, wherein the lead zirconate titanate has a perovskite crystal represented by $Pb_y(Zr_xTi_{1-x})O_3$ (x=0.4 to 0.6, y=1.00 to 1.20).

10. The piezoelectric actuator according to claim 9, wherein an element other than Pb, Zr, and Ti is contained in the piezoelectric layer.

11. The piezoelectric actuator according to claim 10, wherein a content of the element in the piezoelectric layer is 0.1 to 2 parts by mass based on 100 parts by mass of the lead zirconate titanate.

* * * * *